(12) United States Patent
Nishihara et al.

(10) Patent No.: US 9,891,483 B2
(45) Date of Patent: Feb. 13, 2018

(54) LIQUID CRYSTAL DISPLAY DEVICE

(71) Applicant: Sharp Kabushiki Kaisha, Osaka-shi, Osaka (JP)

(72) Inventors: Yusuke Nishihara, Osaka (JP); Kazuhiko Tsuda, Osaka (JP); Tetsuo Fukaya, Osaka (JP); Hideki Fujimoto, Osaka (JP); Yoshito Hashimoto, Osaka (JP); Masahiro Shimizu, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 64 days.

(21) Appl. No.: 14/890,600

(22) PCT Filed: Feb. 27, 2014

(86) PCT No.: PCT/JP2014/054912
§ 371 (c)(1),
(2) Date: Nov. 12, 2015

(87) PCT Pub. No.: WO2014/185122
PCT Pub. Date: Nov. 20, 2014

(65) Prior Publication Data
US 2016/0085122 A1    Mar. 24, 2016

(30) Foreign Application Priority Data

May 15, 2013  (JP) ................................. 2013-102974

(51) Int. Cl.
*G02F 1/1343*  (2006.01)
*G09G 3/36*  (2006.01)
(Continued)

(52) U.S. Cl.
CPC ...... *G02F 1/134363* (2013.01); *G02F 1/1368* (2013.01); *G02F 1/134336* (2013.01);
(Continued)

(58) Field of Classification Search
None
See application file for complete search history.

(56) References Cited

U.S. PATENT DOCUMENTS

| 6,456,351 | B1 | 9/2002 | Kim et al. |
| 8,451,203 | B2 * | 5/2013 | Kao ..................... G09G 3/3614 345/90 |

(Continued)

FOREIGN PATENT DOCUMENTS

| JP | 04-223428 A | 8/1992 |
| JP | 2000-029072 A | 1/2000 |

(Continued)

OTHER PUBLICATIONS

Shunpei Yamazaki, New Crystalline Structure Yields Reliable Thin-Film Transistors, 2012.*

(Continued)

*Primary Examiner* — Duane N Taylor, Jr.
(74) *Attorney, Agent, or Firm* — Keating & Bennett, LLP (57) ABSTRACT

A liquid crystal display device includes a plurality of pixels arranged in a matrix pattern, each pixel including a first electrode and a second electrode for generating a transverse electric field, wherein: in a first group of pixels arranged in a line along either a row direction or a column direction, pairs of pixels are arranged repeatedly, each pair of pixels including two adjacent pixels that are different from each other in terms of an electrode structure of at least one of the first electrode and the second electrode; and voltages of the same polarity are applied to the two adjacent pixels included in the pair of pixels, and voltages of different polarities from each other are applied to two pixel pairs adjacent to each other in the first group of pixels.

12 Claims, 8 Drawing Sheets

(51) Int. Cl.
*G02F 1/1368* (2006.01)
*H01L 29/24* (2006.01)
*H01L 29/786* (2006.01)
*G02F 1/1362* (2006.01)

(52) U.S. Cl.
CPC ........... *G09G 3/3614* (2013.01); *H01L 29/24* (2013.01); *H01L 29/7869* (2013.01); *G02F 1/136286* (2013.01); *G09G 2320/028* (2013.01); *G09G 2320/0247* (2013.01)

(56) References Cited

U.S. PATENT DOCUMENTS

| | | | |
|---|---|---|---|
| 2003/0151584 A1 | 8/2003 | Song et al. | |
| 2004/0021625 A1* | 2/2004 | Lee | G09G 3/3614 345/87 |
| 2007/0229447 A1* | 10/2007 | Takahara | G09G 3/3406 345/102 |
| 2008/0158118 A1* | 7/2008 | Ono | G02F 1/134309 345/87 |
| 2009/0179845 A1* | 7/2009 | Song | G09G 3/3614 345/90 |
| 2011/0012821 A1 | 1/2011 | Ogura et al. | |
| 2011/0304787 A1* | 12/2011 | Wang | G02F 1/134309 349/33 |
| 2012/0008059 A1 | 1/2012 | Kim et al. | |
| 2012/0127148 A1* | 5/2012 | Lee | G02F 1/134363 345/212 |
| 2012/0127153 A1 | 5/2012 | Yukawa | |
| 2012/0138922 A1 | 6/2012 | Yamazaki et al. | |
| 2013/0038621 A1* | 2/2013 | Choi | G09G 3/2092 345/589 |
| 2014/0028645 A1* | 1/2014 | Yamazaki | G09G 3/3614 345/209 |
| 2014/0125569 A1 | 5/2014 | Nakata et al. | |
| 2014/0252317 A1* | 9/2014 | Gupta | H01L 51/5203 257/40 |

FOREIGN PATENT DOCUMENTS

| | | |
|---|---|---|
| JP | 2003-233362 A | 8/2003 |
| JP | 2009-237414 A | 10/2009 |
| JP | 2012-113305 A | 6/2012 |
| JP | 2012-134475 A | 7/2012 |
| WO | 2011/007613 A1 | 1/2011 |
| WO | 2013/008668 A1 | 1/2013 |

OTHER PUBLICATIONS

Official Communication issued in International Patent Application No. PCT/JP2014/054912, dated May 13, 2014.

* cited by examiner

(a) n<sup>th</sup> FRAME

| 2V | -1.7V | 2V | -1.7V |
|---|---|---|---|
| + | − | + | − |
| + | − | + | − |
| + | − | + | − |
| + | − | + | − |

(b) n+1<sup>th</sup> FRAME/ n-1<sup>th</sup> FRAME

| -2V | 2.3V | -2V | 2.3V |
|---|---|---|---|
| − | + | − | + |
| − | + | − | + |
| − | + | − | + |
| − | + | − | + |

LIQUID CRYSTAL DISPLAY DEVICE

TECHNICAL FIELD

The present invention relates to a liquid crystal display device, and particularly to a liquid crystal display device of a transverse electric field mode.

BACKGROUND ART

The range of applications and the functionalities of liquid crystal display devices have been increasing. Particularly, display modes having wide viewing angle characteristics, such as MVA (Multi-domain Vertical Alignment) and IPS (In-Plane-Switching), have been developed, and further improvements have been made thereto.

In recent years, liquid crystal display devices of an FFS (Fringe Field Switching) mode, which has evolved from the IPS mode, have been developed. In the IPS mode or the FFS mode, an electric field is generated in an in-plane direction (or an oblique direction) by using the pixel electrode and the common electrode provided on one substrate so as to rotate liquid crystal molecules in a direction parallel to the substrate. Such a display mode is called a "transverse electric field mode (transverse electric field scheme)".

Known among liquid crystal display devices of the transverse electric field mode are liquid crystal display devices of a dual-domain mode that form two types of liquid crystal domains within one pixel. In such a display device, two types of sub-pixel regions different from each other in terms of the electrode structure (e.g., the direction of the slit provided in the pixel electrode) are provided within one pixel, and liquid crystal molecules of different sub-pixel regions rotate in opposite directions in the presence of an applied voltage.

In a liquid crystal display device of a dual-domain mode, two types of liquid crystal domains whose directors cross each other are formed when a voltage is applied. This reduces the generation of a color shift because the retardation offset is compensated even when observed from a direction parallel to the director of one liquid crystal domain, for example.

However, with small-sized display devices used in mobile devices, or the like, the size of one pixel has decreased as the definition increases, and it is in some cases difficult to form electrode structures (e.g., a plurality of "V"-shaped electrodes/slits) for forming dual domains within one pixel.

In view of this, schemes have been proposed in which different domains are formed in two adjacent pixels, rather than within one pixel. For example, Patent Document No. 1 discloses a technique for liquid crystal display devices of the IPS mode, in which different electrode structures are provided in two adjacent pixels, thereby forming two types of domains of which the directions of liquid crystal molecule rotation are opposite from each other. In the present specification, the scheme in which two types of liquid crystal domains are formed by using two adjacent pixels may be referred to as "pseudo dual-domain". For example, Patent Document No. 2 discloses a liquid crystal display device of the FFS mode employing a pseudo dual-domain configuration.

Figure 1:
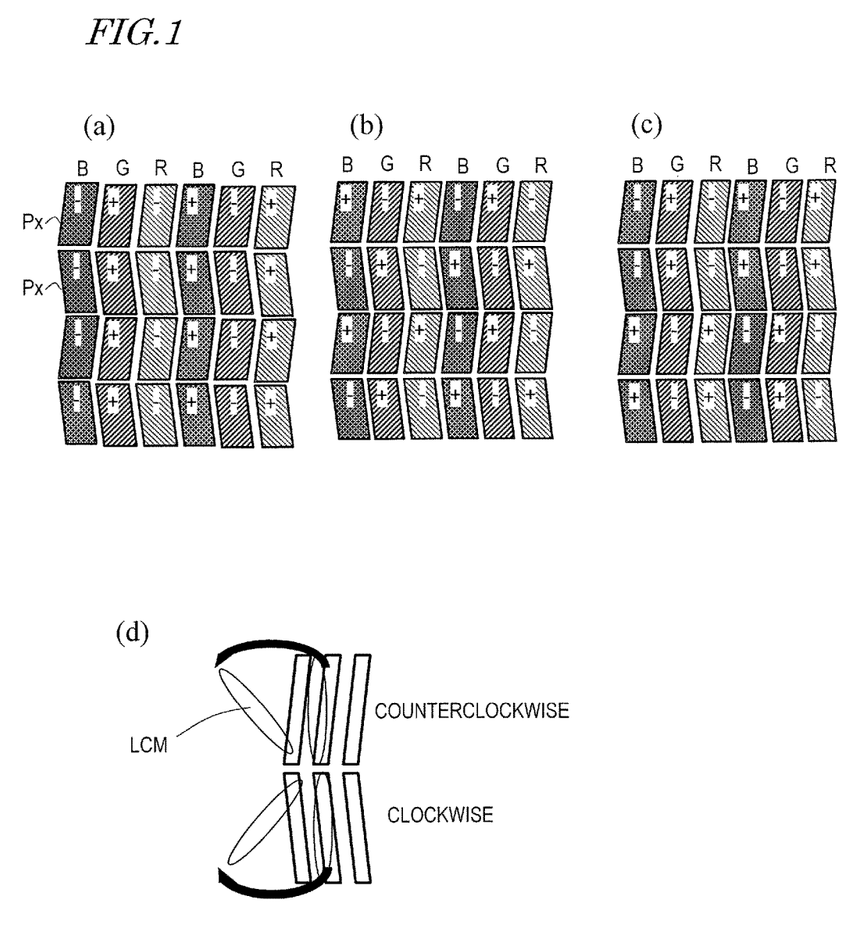

In a pseudo dual-domain liquid crystal display device, there are formed two types of liquid crystal domains whose director directions are different from each other between two adjacent pixels in the presence of an applied voltage (see FIG. 1(d)). Thus, as with a dual-domain mode realized with one pixel described above, it is possible to improve the viewing angle characteristics of a liquid crystal display device of a transverse electric field mode.

CITATION LIST

Patent Literature

[Patent Document No. 1] Japanese Laid-Open Patent Publication No. 2000-29072
[Patent Document No. 2] Japanese Laid-Open Patent Publication No. 2009-237414
[Patent Document No. 3] International Publication WO 2011/007613
[Patent Document No. 4] International Publication WO 2013/008668

SUMMARY OF INVENTION

Technical Problem

Also, as to schemes of driving liquid crystal display devices, schemes have been used in which voltages of different polarities are applied to a plurality of pixels. For example, known schemes include a scheme in which the polarity of the applied voltage is alternated for each source bus line (the column (column line) inversion driving scheme), and a scheme in which the polarity of the applied voltage is alternated between two pixels adjacent to each other in the up-down and left-right directions (the dot-inversion driving scheme). With the inversion driving scheme described above, the polarity of the voltage applied to each pixel may be inverted every frame (e.g., one vertical scanning period).

Patent Document No. 3 discloses the 2H dot-inversion driving scheme in which the polarity of the voltage is inverted for every two pixels. More specifically, in the liquid crystal display device described in Patent Document No. 3, groups of two pixels on the left side of one source bus line and groups of two pixels on the right side of the source bus line are alternately connected to the source bus line, and the polarity of the signal voltage is alternated between odd-numbered source bus lines and even-numbered source bus lines, thereby realizing a two-horizontal-pixel (2H) dot-inversion driving operation.

According to a study by the present inventors, flicker may be visually perceived more easily if a driving scheme such as the column-inversion driving scheme described above is used with a liquid crystal display device of a transverse electric field mode in which the electrode structure is varied between adjacent pixels, such as the pseudo dual-domain configuration.

The present invention has been made to solve the problems set forth above, and an object thereof is to provide a liquid crystal display device of a transverse electric field mode with which flicker is less observed.

Solution to Problem

A liquid crystal display device according to an embodiment of the present invention is a liquid crystal display device including a plurality of pixels arranged in a matrix pattern, each pixel including a first electrode and a second electrode for generating a transverse electric field, wherein: in a first group of pixels, of the plurality of pixels, arranged in a line along either a row direction or a column direction, pairs of pixels are arranged repeatedly, each pair of pixels including two adjacent pixels that are different from each other in terms of an electrode structure of at least one of the first electrode and the second electrode; and voltages of the same polarity are applied to the two adjacent pixels included in the pair of pixels, and voltages of different polarities from each other are applied to two pixel pairs adjacent to each other in the first group of pixels.

In one embodiment, there are a second group of pixels, adjacent to the first group of pixels, the second group of pixels including a plurality of pixels arranged in the same direction as the first group of pixels, and wherein voltages of different polarities from each other are applied to the pair of pixels included in the first group of pixels and another pair of pixels included in the second group of pixels, the pairs of pixels being adjacent to each other.

In one embodiment, the pair of pixels of the first group of pixels are commonly connected to one source bus line, and another pair of pixels of the second group of pixels that are located diagonally from the pair of pixels commonly connected to the source bus line are commonly connected to the source bus line.

In one embodiment, two adjacent pixels of the pair of pixels each have a plurality of elongate electrode portions or slits in at least one of the first and second electrodes, and the two adjacent pixels are different from each other in terms of a direction in which the plurality of elongate electrode portions or slits extend.

In one embodiment, a polarity of a voltage applied to each of the plurality of pixels is inverted every frame.

In one embodiment, one frame includes a period during which a display signal voltage is applied, and another period during which a display signal voltage is not applied.

In one embodiment, a drive frequency for driving the pixels is 1 Hz or more and 50 Hz or less.

In one embodiment, a drive frequency for driving the pixels is 1 Hz or more and 30 Hz or less.

In one embodiment, the plurality of pixels each include a TFT, and the TFT includes an oxide semiconductor layer as an active layer.

In one embodiment, the oxide semiconductor layer includes an In—Ga—Zn—O-based semiconductor.

In one embodiment, the In—Ga—Zn—O-based semiconductor includes crystalline portions.

Advantageous Effects of Invention

According to an embodiment of the present invention, there is provided a liquid crystal display device of a transverse electric field mode with which flicker is reduced and the viewing angle characteristics are improved.

BRIEF DESCRIPTION OF DRAWINGS

FIG. 1 (a) to (c) are plan views showing the polarities of voltages applied to pixels Px for the column-inversion driving operation, the 1H dot-inversion driving operation and the 2H dot-inversion driving operation, respectively, and (d) is a plan view showing the action of liquid crystal molecules LCM in an FFS-mode liquid crystal display device of a pseudo dual-domain configuration.

FIG. 5 (a) to (d) are partial enlarged views corresponding to areas 5A to 5D shown in FIG. 4.

FIG. 6 (a) is a cross-sectional view showing an area of a liquid crystal display device 100 corresponding to one pixel, (b) and (c) are cross-sectional views each showing an area of a liquid crystal display device corresponding to one pixel according to a different alternative example.

FIG. 7 Graphs showing the relationship between the drive frequency and the flicker rate, wherein (a) is a graph for a column-inversion driving operation, (b) and (c) are graphs for a 1H dot-inversion driving operation and a 2H dot-inversion driving operation, respectively.

FIG. 10 Diagrams showing waveforms of the display signal voltage for an intermittent driving operation in association with the vertical sync signal, wherein (a) shows the vertical sync signal, (b) shows a case where three signal voltage application periods are provided during one frame, (c) shows a case where two signal voltage application periods are provided during one frame, and (d) shows a case where one signal voltage application period is provided during one frame.

DESCRIPTION OF EMBODIMENTS

First, one factor for the generation of flicker on a liquid crystal display device of a transverse electric field mode will be discussed, based on the findings of the present inventors.

In recent years, liquid crystal display devices have been developed, in which an oxide semiconductor such as an In—Ga—Zn—O-based semiconductor is used as a channel (active layer) of a TFT (thin film transistor). Since oxide semiconductor TFTs have desirable off-leak characteristics, it is possible to employ a mode in which the device is driven while reducing the image-rewriting frequency (drive frequency) compared with conventional techniques. For example, a so-called "intermittent driving operation" (referred to also as "low-frequency driving operation") has been proposed, in which image data is rewritten at a frequency of 1 to several Hz when displaying a still image, etc. By employing such a driving scheme, it is possible to significantly reduce the power consumption. For example, Patent Document No. 4 discloses an intermittent driving scheme.

Now, terms "frame", "vertical scanning period", "drive frequency", etc., used in the present specification will be explained.

With an ordinary liquid crystal display device driven at 60 Hz, a display signal voltage is applied to a pixel every vertical scanning period (about 1/60 second). That is, when driven at 60 Hz, a display signal is applied to a pixel 60 times per one second. One vertical scanning period is referred to also as one frame.

Note however that with the "intermittent driving operation" scheme, a driving scheme is employed, in which a display signal voltage is applied to a pixel in a predetermined vertical scanning period and then the display signal is not applied in one or more subsequent vertical scanning periods. For example, an intermittent driving operation whose drive frequency is 1 Hz may be performed by supplying a display signal voltage to a pixel in one vertical scanning period (one vertical scanning period of 60-Hz driving operation: 1/60 sec), and then resting while not supplying the display signal to a pixel in the subsequent 59 vertical scanning periods (59/60 sec) following the vertical scanning period. Note that with an intermittent driving operation, a voltage may be supplied in a plurality of vertical scanning periods in order to apply an intended display signal voltage to a pixel. For example, a display signal voltage may be supplied to a pixel in the first three vertical scanning periods, and the subsequent 57 vertical scanning periods may be used as an OFF period.

In the present specification, the period assigned for supplying a certain display signal to a pixel is referred to as one frame. With an intermittent driving operation at 1 Hz, one frame includes 60 vertical scanning periods during which signal supply periods and OFF periods are appropriately set. Note that with the 60-Hz driving operation described above, one frame corresponds to one vertical scanning period. As will be understood from the description above, the term "drive frequency" as used in the present specification corresponds to the inverse of one frame period (seconds). For example, where the drive frequency is set to 10 Hz in an intermittent driving operation, one frame period is 0.1 second.

The "frame-inversion driving operation" as used in the present specification means a scheme in which the polarity of the applied voltage is inverted by the unit of one frame. For example, in an intermittent driving operation at 1 Hz, this means that the polarity of the input signal voltage is inverted every second. Note that in an intermittent driving operation, where a signal voltage is applied to a pixel in a plurality of vertical scanning periods in one frame as described above, the polarity of the applied voltage may be inverted every vertical scanning period.

Figure 10:
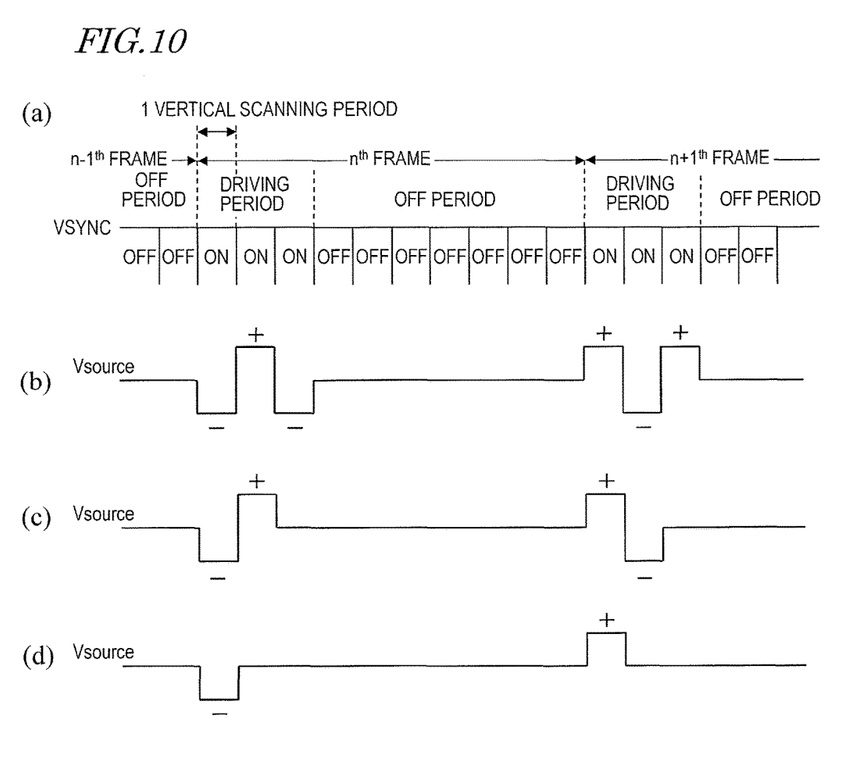

FIGS. 10(a) to 10(d) show examples of timing with which to apply the display signal voltage Vsource in an intermittent driving scheme (FIGS. 10(b) to 10(d)) in association with the vertical sync signal VSYNC (a signal defining one vertical scanning period: FIG. 10(a)). As shown in FIG. 10(a), one frame is composed of 10 vertical scanning periods in the illustrated embodiment.

FIG. 10(b) shows an embodiment in which the display signal voltage is applied only in the three vertical scanning periods starting from the beginning of the frame, and the display signal voltage is not applied in the remaining seven vertical scanning periods. Note that FIG. 10(a) shows the driving period, which corresponds to the display signal voltage Vsource shown in FIG. 10(b), and the OFF period. With this driving scheme, the polarity of the applied voltage is inverted in the next frame (n+1$^{th}$ frame) following a certain frame (n$^{th}$ frame), thus also realizing a frame-inversion driving operation.

FIG. 10(c) shows a driving scheme in which the signal voltage is applied only in the two vertical scanning periods starting from the beginning of the frame while the remaining vertical scanning periods are used as the OFF period, and FIG. 10(d) shows a driving scheme in which the signal voltage is applied only in the first vertical scanning period while the remaining vertical scanning periods are used as the OFF period. The frame-inversion driving operation is used with any of the embodiments shown in FIGS. 10(c) and 10(d).

Note that while FIGS. 10(b) and 10(c) show embodiments where the polarity of the applied voltage is inverted every vertical scanning period during the driving period in one frame, a voltage of the same polarity may be applied over a plurality of vertical scanning periods in one frame.

The factor for the generation of flicker will now be described. Where the intermittent driving operation described above is performed, the pixel voltage is retained over a relatively long gate off period (OFF period).

However, even in this period (e.g., about 0.1 to about 1 second), the retained voltage lowers to some degree, lowering the luminance (in the case of a normally-black configuration). Then, when the next signal voltage is applied at the timing of the next image signal input, even if a signal voltage of the same magnitude is input, there may be a rapid increase of luminance because of the luminance having lowered in the previous frame period.

If such a rapid luminance change occurs at a relatively long cycle, it is likely to be visually perceived as flicker by an observer. This is different from cases where the drive frequency is high, e.g., when driven at 60 Hz or 120 Hz, so that even if luminance changes occur, it is unlikely to be visually perceived as flicker by human eyes because of the short intervals of occurrence. Because of these reasons, it is preferred to employ a driving scheme with which flicker is less likely to be visually perceived, particularly when operated with a drive frequency less than 60 Hz.

On the other hand, the present inventors have found that flicker is more likely to be visually perceived if a column-inversion driving scheme is employed on a liquid crystal display device of a pseudo dual-domain mode. It is believed that one of the reasons for this is that the lowering of the luminance is observed as if it were occurring over two frame periods in a pseudo sense. This phenomenon will now be described in greater detail.

FIGS. 1(a) to (c) show the polarity of the voltage applied for each pixel for the column-inversion driving operation, the 1H dot-inversion driving operation and the 2H dot-inversion driving operation, respectively, used with a liquid crystal display device of a pseudo dual-domain FFS mode. Note that in the illustrated embodiment, pixels Px of three colors of B (blue), G (green) and R (red) are included, and pixels Px of the same color are arranged along the column direction. In the group of pixels arranged in the column direction, two adjacent pixels have different shapes (electrode structures) from each other.

As shown in FIG. 1(a), with the column-inversion driving operation, voltages of the same polarity are applied to a group of pixels arranged along the direction of the source bus line (column direction) (hereinafter, this may be referred to as the vertical pixel column), and voltages of different polarities from each other are applied to two vertical pixel columns adjacent to each other in the row direction.

As shown in FIG. 1(b), with the dot-inversion driving operation, voltages of different polarities from each other are applied to two pixels adjacent to each other in the row direction and the column direction. The dot-inversion driving operation can be realized by, for example, connecting pixels arranged in the column direction alternately to left and right source bus lines (zigzag arrangement), and alternating the polarity of the signal input to the source bus line from one column another. Note that in the present specification, such a driving scheme may be referred to as the 1H dot-inversion driving operation (a dot-inversion driving operation for every horizontal pixel row).

Moreover, FIG. 1(c) shows a variation of the dot-inversion driving operation. With this driving scheme, in each vertical pixel column, voltages of the same polarity are applied to predetermined two adjacent pixels (hereinafter referred to also as one pair of pixels), whereas voltages of a polarity that is different from that of the first pair of pixels are applied to another pair of pixels that is adjacent to the first pair of pixels in the column direction. Along another vertical pixel column adjacent in the row direction to the first vertical pixel column, voltages of a different polarity are applied to a pair of pixels adjacent to the first pair of pixels. Note that in the present specification, such a driving scheme may be referred to as the 2H dot-inversion driving operation (a dot-inversion driving operation for every two horizontal pixel rows). As will be described later, a liquid crystal display device according to an embodiment of the present invention is driven by this scheme.

Note that FIG. 1(d) shows how two types of liquid crystal domains are formed by two adjacent pixels on a liquid crystal display device of a pseudo dual-domain configuration.

As can be seen from FIG. 1(d), two adjacent pixels are different from each other in terms of the electrode structure (the direction in which the slit extends), and the liquid crystal molecules LCM rotate in opposite directions from each other in the presence of an applied voltage. Thus, two types of liquid crystal domains are formed whose director directions are typically different from each other by about 90°.

Figure 2:
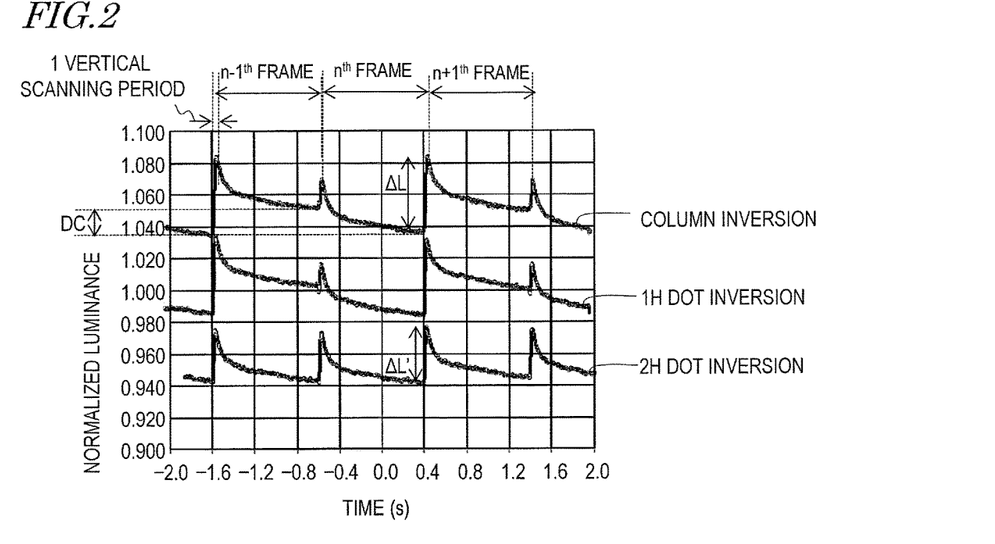
FIG. 2 A graph showing the change over time of the normalized luminance of a panel when driven at 1 Hz with the column-inversion driving operation, the 1H dot-inversion driving operation and the 2H dot-inversion driving operation.

Next, how the panel luminance changes when each of the driving schemes is used will be described. FIG. 2 shows the change of the normalized relative luminance when the column-inversion driving operation, the 1H dot-inversion driving operation and the 2H dot-inversion driving operation are used with a liquid crystal display device of a pseudo dual-domain configuration. The frame-inversion driving operation is also used with each inversion driving scheme, so that the polarity of the voltage applied to each pixel is inverted between a certain frame and the next frame.

The graph shown in FIG. 2 illustrates the change over time of the average panel luminance when maximum signal voltages having the same absolute value are applied to all pixels every second while the drive frequency (the signal voltage input frequency) is set to 1 Hz.

As can be seen from the upper curve of FIG. 2, where the column-inversion driving operation is used with a liquid crystal display device of a pseudo dual-domain configuration, the periodic pattern of the luminance change occurs at 0.5 Hz (2-second interval) even though it is driven at 1 Hz (a driving scheme where, typically, a signal voltage is applied only once per second in one vertical scanning period, and the intermittent driving operation is performed in the vertical scanning periods other than the voltage-applying timing).

Figure 3:
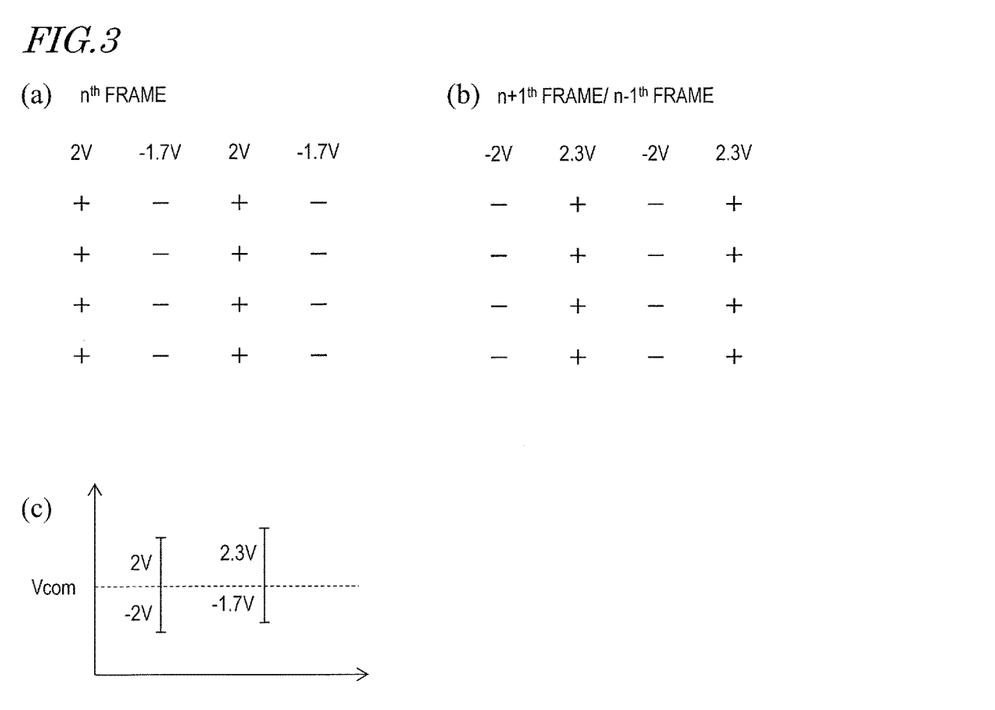
FIG. 3 Diagrams illustrating an operation of the column-inversion driving operation (column line-inversion driving operation), wherein (a) shows the voltage applied to pixels in the $n^{th}$ frame, (b) shows the voltage applied to pixels in the $n+1^{th}$ frame, and (c) shows how the optimal counter voltage Vcom is offset between the $n^{th}$ frame and the $n+1^{th}$ frame.

It is believed that such a pattern of luminance change is formed because as shown in FIGS. 3(a) and 3(b), with the column-inversion driving operation, between a frame in which a voltage of the positive polarity is applied to a predetermined source bus line (the $n^{th}$ frame: n is a natural number) and the next frame in which a voltage of the negative polarity is applied to the same source bus line (the $n+1^{th}$ frame), even if one attempts to apply the same signal voltage (herein 2 V in absolute value), the voltage to be actually applied to the liquid crystal layer varies.

It is believed that the actually applied voltage varies between two consecutive frames (between the $n^{th}$ frame and the $n+1^{th}$ frame, or between the $n-1^{th}$ frame and the $n^{th}$ frame) because an odd-numbered source bus line and an even-numbered source bus line are significantly different from each other in terms of the line resistance or the electric capacitance associated with the line (e.g., parasitic capacitance). If there is a difference between the electric properties of the lines, the counter voltage Vcom is offset from the optimal value for pixels connected to a predetermined (herein, even-numbered) source bus line as shown in FIG. 3(c). As a result, a voltage of a smaller absolute value than the intended voltage is applied to a pixel as a whole in a predetermined frame, while a voltage of a larger absolute value than the intended voltage is applied in the next frame.

Thus, frames in which a larger voltage is applied alternate with frames in which a smaller voltage is applied, thereby forming a luminance change waveform as shown in FIG. 2. The offset from the optimal counter voltage is believed to correspond to the luminance difference DC shown in FIG. 2.

If the lowering of the luminance occurs continuously over two frame periods (herein, two seconds), rapid luminance increases are observed by the observer with longer intervals. This is likely to be visually perceived as flicker. Note that when driven at 60 Hz or higher, the luminance change occurs with a shorter cycle in the voltage retaining period, and the degree of luminance reduction is also small, so that it is less likely to be recognized as flicker.

As can be seen from the middle curve of FIG. 2, a continuous lowering of the luminance may occur over two frames also when the 1H dot-inversion driving operation is used with a liquid crystal display device of a pseudo dual-domain configuration.

It is believed that this is because where adjacent pixels have different electrode structures as in a pseudo dual-domain configuration, two adjacent pixels of different types are different from each other in terms of the magnitude of the electric resistance or the electric capacitance (e.g., parasitic capacitance). Two adjacent pixels having different liquid crystal orientations is also believed to be a factor. This phenomenon will now be described in greater detail.

Where the 1H dot-inversion driving operation is used, pixels receiving a positive voltage applied thereto and pixels receiving a negative voltage applied thereto alternate with each other in any vertical pixel column. Therefore, the luminance change due to the offset of the optimal counter voltage occurring when employing the column-inversion driving operation described above may be reduced. However, it is believed that also when the 1H dot-inversion driving operation is used, the offset of the optimal counter voltage between two, upper and lower, pixels adjacent to each other in the column direction is not canceled out for the pixel as a whole, and as a result, frames receiving a voltage of a larger absolute value than the intended voltage as a whole alternate with frames receiving a voltage of a smaller absolute value than the intended voltage.

For example, assume that, of a pair of upper and lower pixels, the intended voltage is applied to the upper pixel, whereas a voltage shifted from the intended voltage by ±ϵ (±ϵ1 for odd-numbered source bus lines, ±ϵ2 for even-numbered source bus lines) due to a difference in the electrode structure is applied to the lower pixel. In such a case, in the column direction, a voltage of the same polarity is applied to the lower pixel of any pixel pair, and the voltage offset between ±ϵ1 and ±ϵ2 will not be canceled out for the pixel as a whole. Moreover, in the next frame, a similar phenomenon occurs with the opposite polarity. Thus, it is believed that even if signals of the same magnitude are input, the magnitude of the applied voltage fluctuates from one frame to another, so that the luminance reducing pattern over two frames described above is observed.

In contrast, as can be seen from the lower curve of FIG. 2, if voltages of the same polarity are applied to one pair of pixels, which includes two adjacent pixels of different types, and a pixel-pair-based dot-inversion driving operation (i.e., the 2H dot-inversion driving operation) is used, similar luminance changes are observed for different frames. It is believed that this is because an un-fluctuated, appropriate voltage is applied in a predetermined frame and in the next frame.

For example, assume that, of a pair of upper and lower pixels, a voltage offset from the intended voltage by $\pm\epsilon 1$ and $\pm\epsilon 2$ is applied to the lower pixel. In such a case, in the column direction, the polarity of the voltage applied to the lower pixel is inverted alternately, and the offset of $\pm\epsilon 1$ and $\pm\epsilon 2$ is therefore canceled out for the pixel as a whole. Thus, it is possible to apply a voltage of an intended magnitude for the pixel as a whole. This similarly applies also to the next frame, and it is believed that this reduces the fluctuation of the magnitude of the applied voltage from one frame to another, thereby forming similar luminance waveform patterns for different frames.

As described above, with a liquid crystal display device of a pseudo dual-domain, it can be seen that to reduce rapid luminance changes occurring with twice the cycle, it is effective to use the dot-inversion driving operation (2H/2V dot-inversion driving operation) of an embodiment in which voltages of the same polarity are applied to two adjacent pixels of different types.

As can be seen from FIG. 2, the magnitude of the luminance change occurring for every two frames (the luminance change amount ΔL shown in the graph) is large with the column-inversion driving operation, whereas the luminance change amount ΔL' is relatively small when the 2H dot-inversion driving operation is used. That is, if the 2H dot-inversion driving operation is used, it is possible to reduce the degree of the rapid luminance change occurring periodically, so that flicker is less likely to be visually perceived.

Embodiments of the present invention will now be described. It should be noted that the present invention is not limited thereto.

Figure 4:
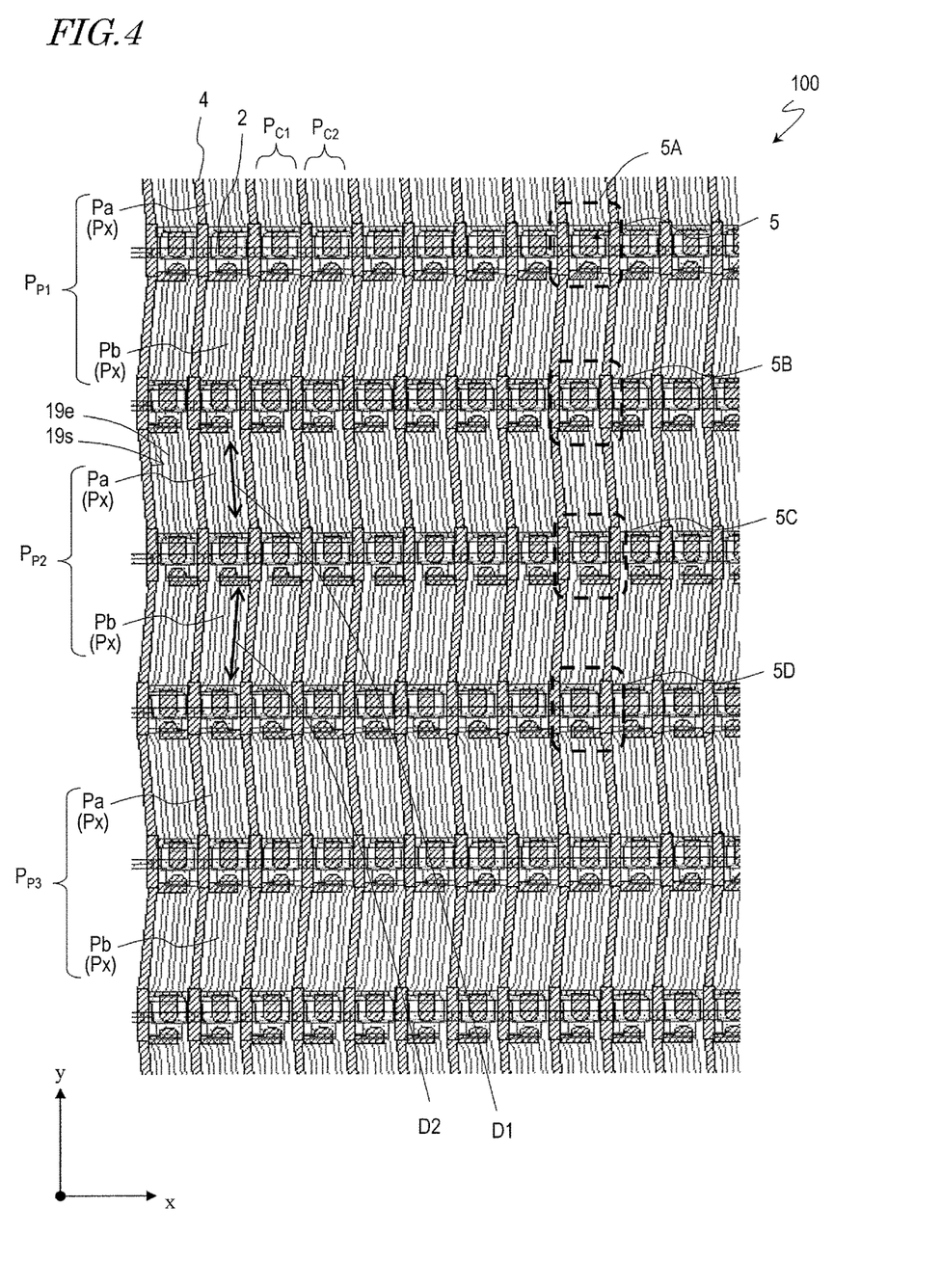
FIG. 4 A plan view showing a pixel configuration of a liquid crystal display device of a pseudo dual-domain FFS mode according to an embodiment of the present invention.

FIG. 4 is a plan view showing a pixel configuration of the liquid crystal display device 100 according to an embodiment of the present invention. FIGS. 5(a) to 5(d) are plan views showing, on an enlarged scale, areas 5A to 5D in the vicinity of TFTs 5 shown in FIG. 4. FIG. 6(a) shows a cross section of an area corresponding to one pixel of the liquid crystal display device 100.

In the liquid crystal display device 100, a plurality of pixels Px are arranged in a matrix pattern, and each pixel is connected to a gate bus line 2 and a source bus line 4 via a TFT 5. The gate bus line 2 extends in the x-axis direction shown in the figure for applying the gate ON/OFF voltage to the gate of the TFT 5. The source bus line 4 extends along the y-axis direction shown in the figure for supplying the signal voltage to the pixel via the TFT 5.

The liquid crystal display device 100 operates in the FFS mode. More specifically, as shown in FIG. 6(a), a transverse electric field (oblique electric field) is generated using a common electrode 18 and a pixel electrode 19 provided on a TFT substrate 10A, of a pair of substrates 10A and 10B interposing a liquid crystal layer LC therebetween, and the liquid crystal molecules are rotated in the substrate plane by the transverse electric field, thereby producing a display.

Note that the TFT substrate 10A includes a gate insulating layer 20, an interlayer insulating layer 22, a common electrode (transparent conductive layer) 18, an upper insulating layer 24, a pixel electrode 19, etc., provided on a transparent substrate 10. Although not shown in FIG. 6(a), the gate bus line 2, the source bus line 4, the TFT 5, etc., are also provided on the TFT substrate 10A. For example, the gate bus line 2 is formed below the gate insulating layer 20, and the source bus line 4 is formed above the gate insulating layer 20. The gate bus line 2 and the source bus line 4 are insulated from each other by the gate insulating layer 20.

Figure 5:
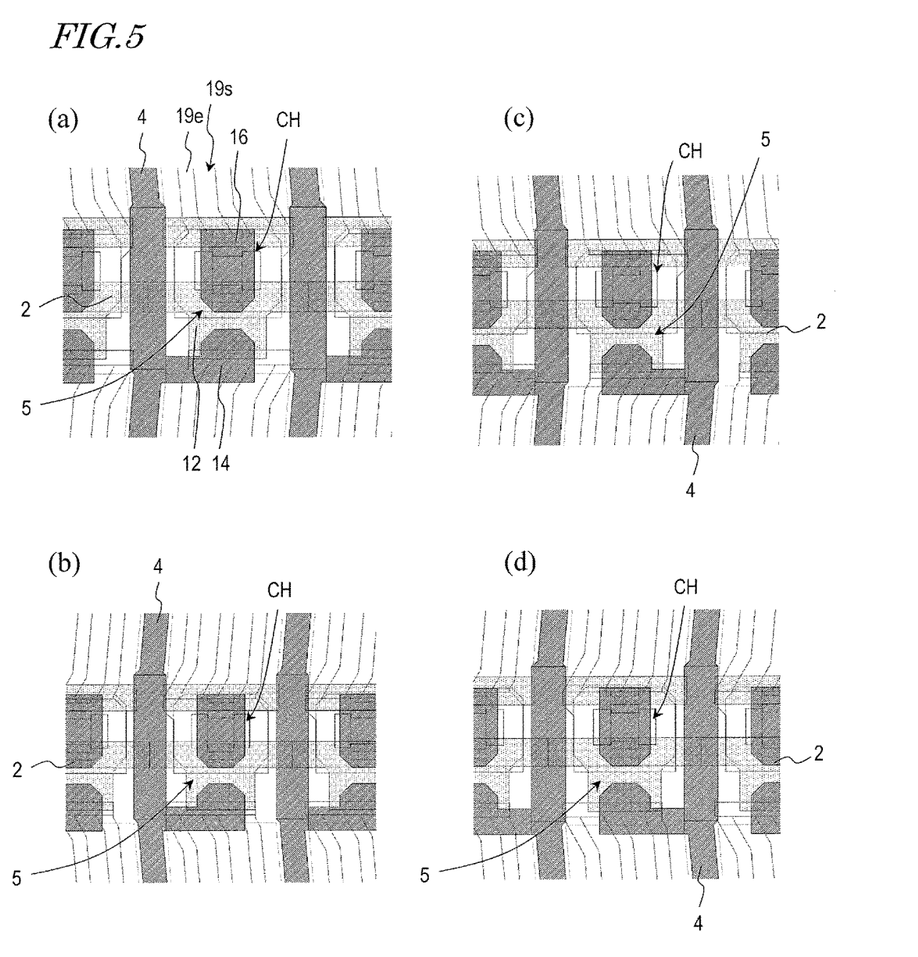
Figure 6:
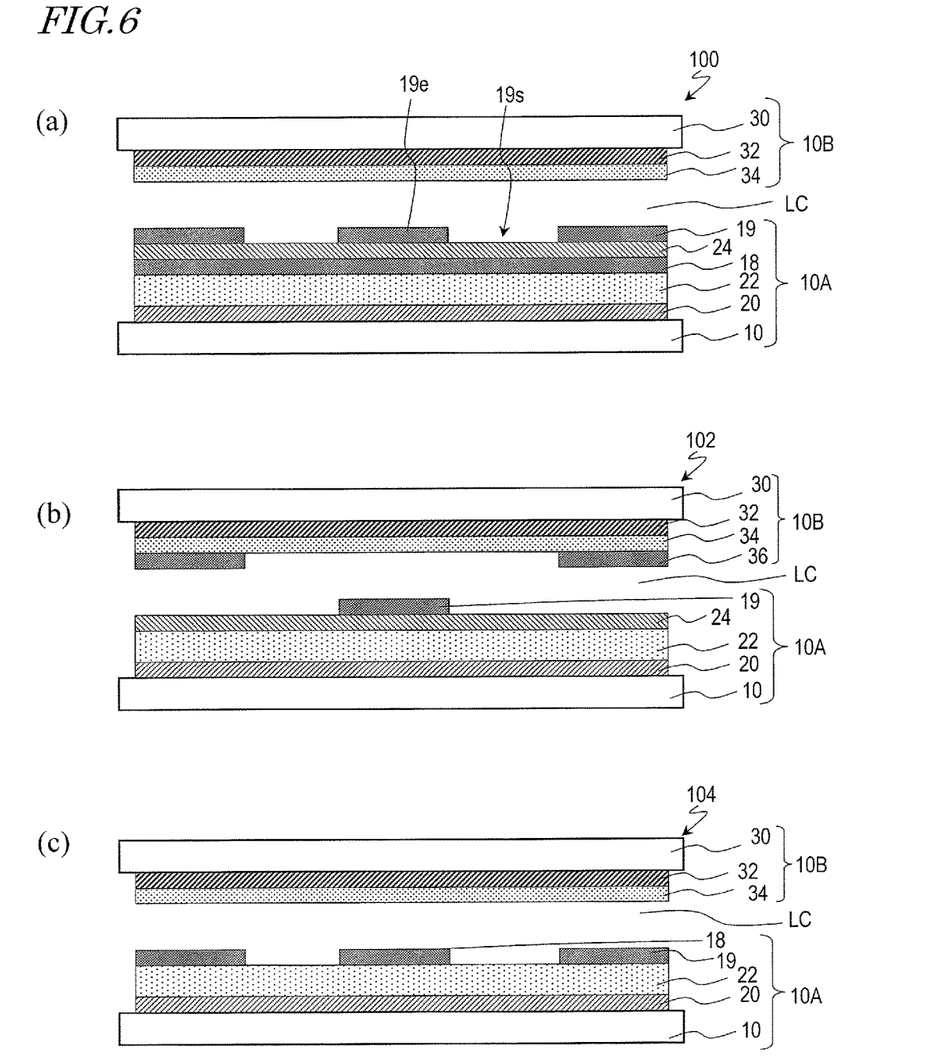

As shown in FIG. 5(a), the TFT 5 includes a gate electrode 12 connected to the gate bus line 2, a source electrode 14 connected to the source bus line 4, a drain electrode 16 provided so as to oppose the source electrode 14 with an interval therebetween, a semiconductor layer (not shown) which is typically island-shaped for connecting between the source electrode 14 and the drain electrode 16, etc.

The TFT 5 is covered with the interlayer insulating layer 22, the upper insulating layer 24 (FIG. 6(a)), etc., and the drain electrode 16 and the pixel electrode 19 are connected through a contact hole CH running through these insulating layers 22 and 24. Note that the common electrode 18 has an opening around the contact hole CH described above, and is insulated from the drain electrode 16 and the pixel electrode 19 of the TFT 5.

A counter substrate 10B opposing the TFT substrate 10A with the liquid crystal layer LC interposed therebetween includes a color filter layer 32, a black matrix (not shown), an overcoat layer 34, etc., provided on a transparent substrate 30. In the present embodiment, the color filter layer 32 includes color filters of three colors of R, G and B, and are arranged so that pixels of the same color are formed for each vertical pixel column as shown in FIG. 1(c). Note that the TFT substrate 10A and the counter substrate 10B can be produced by any known method.

Reference is made again to FIG. 4. Two different types of pixels Pa and Pb, of a plurality of pixels Px, adjacent to each other along the column direction (the y-axis direction illustrated in the figure) have different electrode structures from each other. More specifically, the direction D1 in which elongate electrode portions 19e and slits 19s provided in the pixel electrode of one pixel Pa extend is different from the direction D2 in which they extend in the other pixel Pb. In the present specification, two adjacent pixels Pa and Pb having different electrode structures may be referred to as a pair of pixels $P_{P1}$, $P_{P2}$, $P_{P3}$.

In each vertical pixel column (e.g., the pixel column $P_{c1}$), another pair of pixels $P_{P2}$ similarly including two different types of pixels Pa and Pb (as with the pair of pixels $P_{P1}$) is arranged adjacent to the pair of pixels $P_{P1}$. Between one pair of pixels $P_{P1}$ and another adjacent pair of pixels $P_{P2}$, the arrangement of the two types of pixels Pa and Pb is the same. Also in yet another pair of pixels $P_{P3}$ adjacent to the pair of pixels $P_{P2}$, the arrangement of the pixels Pa and Pb is the same. In each of the vertical pixel columns $P_{c1}$, $P_{c2}$, pixels Pa and pixels Pb are provided for every other pixel.

Moreover, as shown in FIG. 4, each group of pixels arranged in the row direction (the x-axis direction illustrated in the figure) all have a similar pixel shape. As understood from the description above, in the liquid crystal display device 100, pixel pairs are arranged in a matrix pattern along the row direction and the column direction, each pixel pair including two adjacent pixels Pa and Pb of different types.

In the present embodiment, the initial alignment direction of the liquid crystal molecules (the alignment direction in the absence of an applied voltage) is set to be parallel to the y-axis direction shown in FIG. 4, for example. The initial alignment direction is defined by an alignment film (not shown) provided on each of the TFT substrate 10A and the counter substrate 10B so as to be in contact with the liquid crystal layer. The alignment film may be an alignment film that is given a directionality through a rubbing treatment, or a photo-alignment film that is given a directionality through ultraviolet irradiation.

The initial alignment direction is different from the directions D1 and D2 in which the elongate electrode portions 19e extend. More specifically, the direction D1 is off the initial alignment direction by α° counterclockwise, and the direction D2 is off the initial alignment direction by α° clockwise. With such a relationship, in the presence of an applied voltage, liquid crystal molecules in two adjacent pixels Pa and Pb rotate in the opposite directions from each other, thereby forming two liquid crystal domains. The angle α described above is set to 3° to 10°, for example.

The TFT substrate 10A and the counter substrate 10B include, provided thereon, a pair of polarizing elements (not shown) typically arranged in a cross Nicol arrangement. The polarization axis direction (e.g., the transmission axis direction) of these polarizing elements may be set to be parallel or perpendicular to the initial alignment direction.

With the liquid crystal display device 100 having such a configuration, the 2H dot-inversion driving operation described above with reference to FIG. 1(c) is used. That is, voltages of the same polarity are applied to two adjacent pixels Pa and Pb, and voltages of different polarities from each other are applied to a pixel pair $P_{P1}$ and a pixel pair $P_{P2}$ adjacent to each other in the column direction.

Moreover, voltages of different polarities from each other are applied to a predetermined pair of pixels $P_{P1}$ along a predetermined vertical pixel column (group of pixels) $P_{c1}$ and another pixel pair $P_{P1}$, adjacent to the pixel pair $P_{P1}$, along an adjacent pixel column $P_{c2}$. That is, in the present embodiment, the dot-inversion driving operation in which one pair of pixels $P_{P1}$ is treated as one unit (the same polarity) is used.

The applied voltages for all pixels are inverted every frame. Even then, in each frame, voltages of the same polarity are applied to a pair of pixels Pa and Pb, and voltages of different polarities from each other are applied to adjacent pixel pairs $P_{P1}$ and $P_{P2}$ (or the pixel pair $P_{P1}$ along the pixel column $P_{c1}$ and the pixel pair $P_{P1}$ along the pixel column $P_{c2}$ adjacent thereto in the horizontal direction).

An example configuration for realizing the 2-dot-inversion driving operation described above with the liquid crystal display device 100 will be described.

As shown in FIGS. 5(a) and 5(b), with the liquid crystal display device 100, pixels Pa and Pb included in a pair of pixels $P_{P1}$ along a vertical pixel column are connected to a source bus line 4 that is located on the left side of the pixels. On the other hand, as shown in FIGS. 5(c) and 5(d), along the same pixel column, pixels Pa and Pb included in another pixel pair $P_{P2}$ adjacent to the pixel pair $P_{P1}$ are connected to a source bus line 4 that is located on the right side of the pixels. Note that in the present embodiment, a plurality of pixels arranged in the row direction (group of horizontal pixels) are all connected to source bus lines on the same side.

A configuration where a source bus line is connected to pixels on the left side and pixels on the right side as described above is referred to also as a zigzag (staggered) arrangement (e.g., Patent Document No. 3). With the liquid crystal display device 100, a zigzag arrangement is realized with one pair of pixels being one unit. In the zigzag arrangement, one pair of pixels $P_{P1}$ included in a predetermined pixel column $P_{c2}$ is commonly connected to one source bus line, and another pair of pixels $P_{P2}$ along the next pixel column $P_{c1}$ located diagonally from the pixel pair are also commonly connected to the same source bus line.

Where left and right pixels are arranged alternately two by two with respect to the source bus line 4 as described above, the 2H dot-inversion driving operation shown in FIG. 1(c) can be realized by performing an inversion driving operation in which the polarity of the applied voltage is varied between adjacent source bus lines.

Note however that the 2H dot-inversion driving operation may be realized by a different method. For example, one can employ a conventional configuration where pixels arranged in the column direction are connected to one source bus line, rather than using the zigzag arrangement described above, wherein the source driver may be controlled so that signal voltages of different polarities are actually applied to corresponding pixels.

While the liquid crystal display device 100 according to an embodiment of the present invention has been described above, the liquid crystal display device of the present invention may have another configuration.

FIG. 6(b) is a cross-sectional view showing an area of a liquid crystal display device 102 of Variation 1 corresponding to one pixel. In the liquid crystal display device 102, the common electrode 18 (FIG. 6(a)) is not provided on the TFT substrate 10A, but instead, a counter common electrode 36 is provided on the counter substrate 10B. The counter common electrode 36 includes elongate electrode portions arranged in a diagonally upward direction from the elongate electrode portion of the pixel electrode 19 so as not to overlap with the elongate electrode portion of the pixel electrode 19. In this configuration, an oblique electric field is generated between the pixel electrode 19 and the counter common electrode 36, and the liquid crystal molecules can be rotated in-plane by the oblique electric field, thereby producing a display in a transverse electric field mode.

FIG. 6(c) is a cross-sectional view showing an area of a liquid crystal display device 104 of Variation 2 corresponding to one pixel. The liquid crystal display device 104 is a liquid crystal display device in an IPS mode, and includes the common electrode 18 and the pixel electrode 19 in the same layer. The common electrode 18 and the pixel electrode 19 each have a comb-like planar shape such that their comb teeth are meshed with each other. With such a configuration, a transverse electric field is produced between the pixel electrode 19 and the common electrode 18, and the liquid crystal molecules can be rotated in-plane by the transverse electric field, thereby producing a display in a transverse electric field mode.

Example and Comparative Examples of the present invention will now be described.

Figure 7:
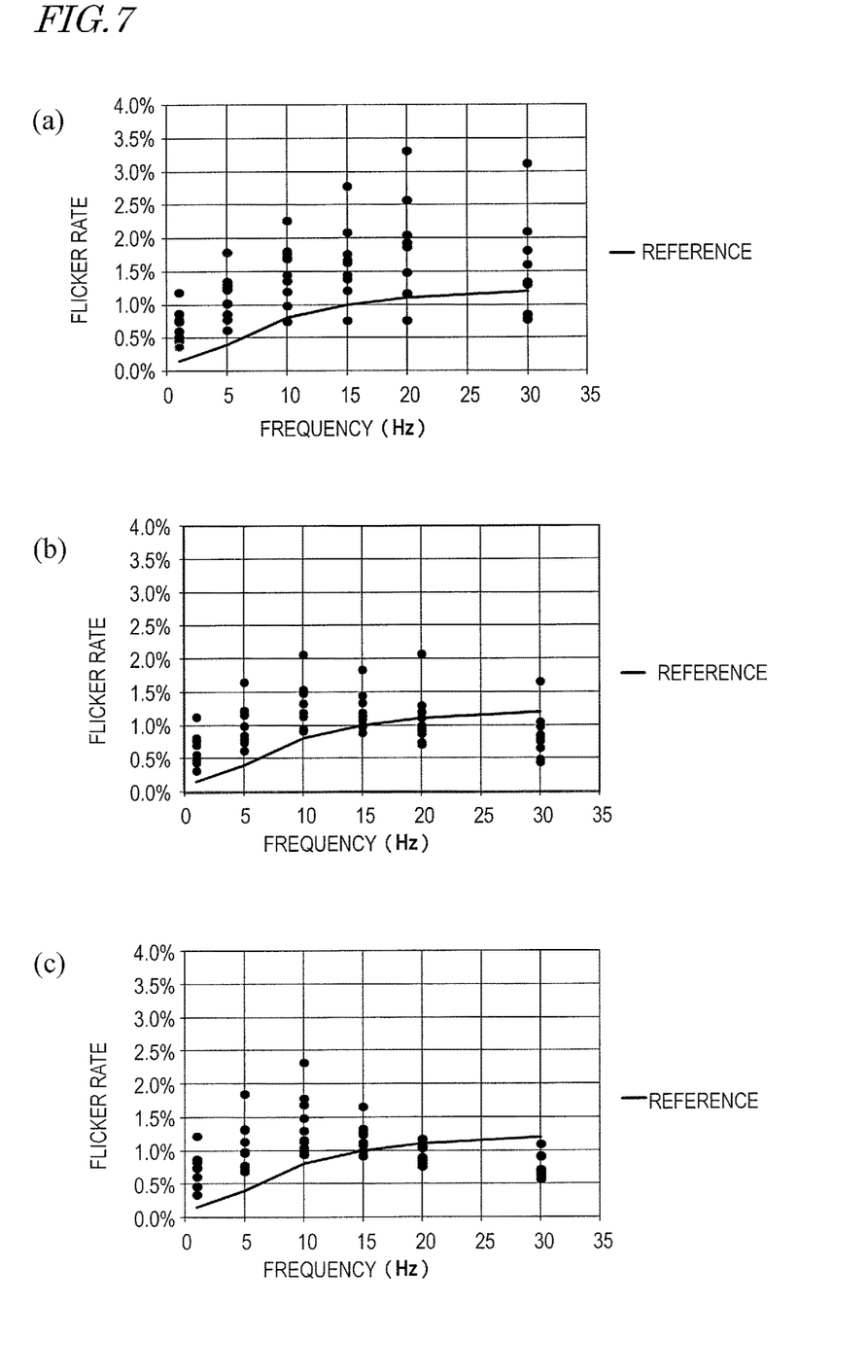

FIGS. 7(a) to 7(c) show the relationship between the drive frequency and the flicker rate where the column-inversion driving operation (Comparative Example 1), the 1H dot-inversion driving operation (Comparative Example 2) and the 2H dot-inversion driving operation (Example), respectively, are used with a liquid crystal display device (about 5 inches diagonally) operating in a pseudo dual-domain mode. Note that FIGS. 7(a) to 7(c) also show a reference flicker rate curve for an ordinary display panel, for the purpose of reference.

Herein, the vertical axis represents the visible flicker as flicker rate. The visible flicker is obtained by Fouriertransforming and decomposing a luminance waveform, which has been taken into an oscilloscope, into frequency components, which are multiplied by a human visibility curve. The plots in each figure show a collection of test results for different types of liquid crystal panels. The liquid crystal panels include those using a positive-type liquid crystal material and those using a negative-type liquid crystal material.

As can be seen from FIG. 7(a), the flicker rate increases when the column-inversion driving operation is performed. Particularly, the flicker rate is high when driven at 10 Hz to 30 Hz. As shown in FIG. 7(b), it can be seen that the flicker rate is reduced for most drive frequencies when the 1H dot-inversion driving operation is performed, as compared with the column-inversion driving operation. However, the flicker rate is not sufficiently reduced particularly when driven at 20 to 30 Hz.

In contrast, as can be seen from FIG. 7(c), where the 2H dot-inversion driving operation is performed, the flicker rate is sufficiently reduced even when driven at 20 to 30 Hz.

Figure 8:
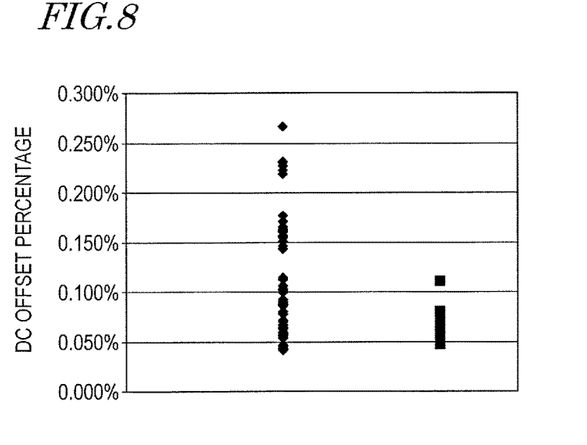
FIG. 8 A graph showing the luminance offset (DC offset percentage) when driven at 1 Hz, wherein solid diamonds represent the column-inversion driving operation, and solid squares represent the 2H dot-inversion driving operation.

FIG. 8 shows the difference between the DC offset percentage obtained when the column-inversion driving operation is performed and that obtained when the 2H dot-inversion driving operation is performed, where the drive frequency is set to 1 Hz. Herein, the DC offset percentage is an index representing DC offset amount/ average luminance. Note that the DC offset amount means the difference between luminance observed in contiguous frames, as shown in FIG. 2.

As can be seen from FIG. 8, with the 2H dot-inversion driving operation (solid squares), as compared with the column-inversion driving operation (solid diamonds), the DC offset amount decreases, and flicker occurring at a frequency that is half the drive frequency is less visually perceived. Herein, with the 2H dot-inversion driving operation, the 0.5-Hz luminance pattern waveform is not formed, thus indicating that flicker has been reduced appropriately.

Figure 9:
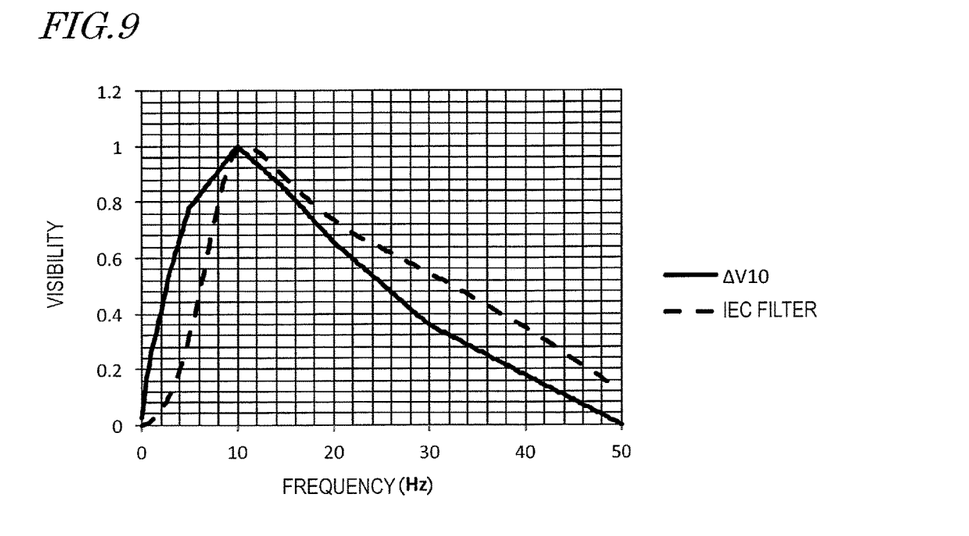
FIG. 9 A graph showing the relationship between the drive frequency and the visibility, which represents the degree of annoyance of flicker.

FIG. 9 shows the relationship between the luminance change frequency and how easily a luminance change, when it occurs at the frequency, is visually perceived by a human eye as flicker (referred to as the "visibility"). The "visibility" is described in detail, for example, in a report from Central Research Institute of Electric Power Industry (Research report: T99041, May 2000) entitled "Problems of estimation technique for voltage fluctuation and research subjects—Comparison between ΔV10 meter and IEC flicker meter—".

As shown in FIG. 9, a test evaluating the degree of annoyance of flickering using a ΔV10 meter and an IEC flicker meter has indicated that a voltage (luminance) fluctuation particularly at a frequency of around 10 Hz is visually perceived as flickering that is very annoying to human eyes.

Therefore, when a liquid crystal display device is driven at about 20 Hz, if flickering occurs at half the frequency, it will be very conspicuous; therefore, it is preferred to use the 2H dot inversion to reduce this. Since flickering is easily recognized at about 1 Hz to about 50 Hz, the liquid crystal display device according to an embodiment of the present invention may be driven at about 1 Hz to about 50 Hz, for example. Particularly, when driven at 1 Hz to 30 Hz, the liquid crystal display device of an embodiment of the present invention is expected to provide a significant effect of reducing flicker.

In the liquid crystal display device 100 described above, the TFT 5 may include an oxide semiconductor layer as an active layer. Using an oxide semiconductor layer, it is possible to obtain an appropriate device characteristic (OFF characteristic) for realizing a low-frequency driving operation.

The oxide semiconductor layer provided in the TFT 5 includes, for example, an In—Ga—Zn—O-based semiconductor (hereinafter referred to simply as "In—Ga—Zn—O-based semiconductor"). Herein, an In—Ga—Zn—O-based semiconductor is a ternary oxide of In (indium), Ga (gallium) and Zn (zinc), wherein the proportion (composition ratio) between In, Ga and Zn is not limited to any particular proportion, and includes, for example, In:Ga:Zn=2:2:1, In:Ga:Zn=1:1:1, In:Ga:Zn=1:1:2, and the like. In the present embodiment, the oxide semiconductor layer may be an In—Ga—Zn—O-based semiconductor layer including In, Ga and Zn at a proportion of In:Ga:Zn=1:1:1, for example.

Since a TFT having an In—Ga—Zn—O-based semiconductor layer has a high mobility (more than 20 times that of a-Si TFT) and a low leak current (less than a hundredth of that of a-Si TFT), the TFT can be suitably used as a driver TFT and a pixel TFT. Using a TFT having an In—Ga—Zn—O-based semiconductor layer, it is possible to significantly reduce the power consumption of the display device.

The In—Ga—Zn—O-based semiconductor may be amorphous or may be crystalline, including crystalline portions. A preferred crystalline In—Ga—Zn—O-based semiconductor is a crystalline In—Ga—Zn—O-based semiconductor of which the c axis is generally oriented vertical to the layer plane. The crystal structure of such an In—Ga—Zn—O-based semiconductor is disclosed in Japanese Laid-Open Patent Publication No. 2012-134475, for example. The entire disclosure of Japanese Laid-Open Patent Publication No. 2012-134475 is herein incorporated by reference.

The oxide semiconductor layer may include another oxide semiconductor, instead of an In—Ga—Zn—O-based semiconductor. For example, it may include a Zn—O-based semiconductor (ZnO), an In—Zn—O-based semiconductor (IZO (registered trademark)), a Zn—Ti—O-based semiconductor (ZTO), a Cd—Ge—O-based semiconductor, a Cd—Pb—O-based semiconductor, CdO (cadmium oxide), an Mg—Zn—O-based semiconductor, an In—Sn—Zn—O-based semiconductor (e.g., $In_2O_3$—$SnO_2$—ZnO), an In—Ga—Sn—O-based semiconductor, etc.

While an embodiment of the present invention has been described above, various other modifications can be made thereto. While a liquid crystal display device having a pseudo dual-domain configuration has been described, other configurations may be used. For example, in an embodiment where a main pixel and a sub-pixel, which has a different electrode configuration from the main pixel, are driven separately, the 2H dot-inversion driving operation described above may be used using the main pixel and the sub-pixel as a pair of pixels.

While the above description has been directed to an embodiment where two different pixel configurations are alternately repeated in the column direction, it may be an embodiment where two different pixel configurations are alternately repeated in the row direction. In such a case, flicker can be reduced by using the 2V dot-inversion driving operation (the dot-inversion driving operation for every two vertical pixel columns).

While the above description has been directed to an example where the dot inversion for every two lines is used, flicker can be reduced also by inverting the polarity for every four lines, six lines, . . . , 2n lines (even-numbered lines).

INDUSTRIAL APPLICABILITY

The liquid crystal display device according to an embodiment of the present invention can be used widely a various types of display devices, including medium- to small-sized display devices such as mobile devices and tablet terminals, and display devices for televisions and digital signage.

REFERENCE SIGNS LIST

2 Gate bus line
4 Source bus line
5 TFT
10 Transparent substrate
18 Common electrode
19 Pixel electrode
10A TFT substrate
10B Counter substrate
100 Liquid crystal display device
LC Liquid crystal layer

The invention claimed is:

1. A liquid crystal display device comprising:
a first substrate and a second substrate;
a liquid crystal layer between the first substrate and the second substrate; and
a plurality of pixels arranged in a matrix pattern, each pixel including a first electrode and a second electrode that are located on the first substrate and that generate a transverse electric field between the first electrode and the second electrode, one of the first electrode and the second electrode being a pixel electrode, the other of the first electrode and the second electrode being a common electrode, wherein:
in a first group of pixels, of the plurality of pixels, arranged in a line along either a row direction or a column direction, pairs of pixels are arranged repeatedly, each pair of pixels including two adjacent pixels that include a different electrode structure of at least one of the first electrode and the second electrode;
the two adjacent pixels of the pair of pixels each include a plurality of elongate electrode portions or slits in at least one of the first electrode and the second electrode, and a direction in which the plurality of elongate electrode portions or slits extend are different between the two adjacent pixels; and
voltages of a same polarity are applied to the two adjacent pixels included in the pair of pixels, and voltages of different polarities from each other are applied to two pixel pairs adjacent to each other in the first group of pixels.

2. The liquid crystal display device according to claim 1, wherein
the liquid crystal display device includes a second group of pixels, adjacent to the first group of pixels, the second group of pixels including a plurality of pixels arranged in a same direction as the first group of pixels, and
voltages of different polarities from each other are applied to the pair of pixels included in the first group of pixels and another pair of pixels included in the second group of pixels, the pairs of pixels being adjacent to each other.

3. The liquid crystal display device according to claim 2, wherein
the pair of pixels of the first group of pixels are commonly connected to one source bus line, and
another pair of pixels of the second group of pixels that are located diagonally from the pair of pixels commonly connected to the source bus line are commonly connected to the source bus line.

4. The liquid crystal display device according to claim 1, wherein a polarity of a voltage applied to each of the plurality of pixels is inverted every frame.

5. The liquid crystal display device according to claim 1, wherein one frame includes a period during which a display signal voltage is applied, and another period during which a display signal voltage is not applied.

6. The liquid crystal display device according to claim 1, wherein a drive frequency for driving the pixels is 1 Hz or more and 50 Hz or less.

7. The liquid crystal display device according to claim 6, wherein a drive frequency for driving the pixels is 1 Hz or more and 30 Hz or less.

8. The liquid crystal display device according to claim 1, wherein the plurality of pixels each include a TFT, and the TFT includes an oxide semiconductor layer as an active layer.

9. The liquid crystal display device according to claim 8, wherein the oxide semiconductor layer includes an In—Ga—Zn—O-based semiconductor.

10. The liquid crystal display device according to claim 9, wherein the In—Ga—Zn—O-based semiconductor includes crystalline portions.

11. The liquid crystal display device according to claim 1, wherein
the first electrode and the second electrode generate the transverse electric field to rotate liquid crystal molecules in each of the plurality of pixels in a direction parallel to the first substrate; and
the plurality of elongate electrode portions or slits of the two adjacent pixels extend to rotate the liquid crystal molecules in the two adjacent pixels in opposite directions from each other by the transverse electric field.

12. The liquid crystal display device according to claim 1, wherein the plurality of elongate electrode portions or slits of the two adjacent pixels extend respectively in directions off either the row direction or the column direction by $\alpha°$ counterclockwise and by $\alpha°$ clockwise.

* * * * *